United States Patent
Ma

(10) Patent No.: US 8,019,457 B2
(45) Date of Patent: Sep. 13, 2011

(54) METHOD OF CONTROLLING RESULT PARAMETER OF IC MANUFACTURING PROCEDURE

(75) Inventor: Hong Ma, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 374 days.

(21) Appl. No.: 12/102,202

(22) Filed: Apr. 14, 2008

(65) Prior Publication Data

US 2009/0259330 A1    Oct. 15, 2009

(51) Int. Cl.
*G06F 19/00*    (2011.01)

(52) U.S. Cl. ...................................................... 700/110

(58) Field of Classification Search .............. 700/30–33, 700/110
See application file for complete search history.

(56) References Cited

U.S. PATENT DOCUMENTS

| | | | |
|---|---|---|---|
| 5,410,883 A * | 5/1995 | Nigawara et al. ............... | 60/646 |
| 6,427,093 B1 | 7/2002 | Toprac | |
| 6,701,206 B1 | 3/2004 | Markle et al. | |
| 7,047,099 B2 | 5/2006 | Shanmugasundram et al. | |
| 7,142,940 B2 * | 11/2006 | Ma et al. ........................ | 700/121 |
| 7,630,064 B2 * | 12/2009 | Tanaka ............................ | 356/72 |
| 7,689,028 B2 * | 3/2010 | Sakano et al. ................. | 382/145 |
| 2008/0084197 A1 * | 4/2008 | Williams et al. .............. | 323/282 |

* cited by examiner

*Primary Examiner* — Albert Decady
*Assistant Examiner* — Chad Rapp
(74) *Attorney, Agent, or Firm* — WPAT, PC; Justin King

(57) ABSTRACT

A method of controlling a result parameter of an IC manufacturing procedure is described. The value of at least one first variable of a process correlated with the result parameter is acquired, and the difference between the predicted value and the target value of the result parameter is calculated from the same using a correlation equation of the first variable and the result parameter. A correcting action is then performed to a subsequent process including at least one second variable correlated with the result parameter, which is based on a correlation equation of the second variable and the result parameter to control the subsequent process and adjust the second variable such that the difference is reduced due to the affect of the second variable to the result parameter. The at least one first variable and the at least one second variable include two or more different physical quantities.

16 Claims, 1 Drawing Sheet

METHOD OF CONTROLLING RESULT PARAMETER OF IC MANUFACTURING PROCEDURE

BACKGROUND OF THE INVENTION

1. Field of Invention

The present invention relates to a method of controlling an integrated circuit (IC) manufacturing procedure, and more particularly relates to a method of controlling a result parameter of an IC manufacturing procedure.

2. Description of Related Art

As the linewidth of IC device becomes smaller, the control of its properties gets more important. A characteristic value of an IC device usually relates to a plurality of processes in its manufacturing procedure, while the processes include a plurality of variables correlated with the characteristic value that have a number at least equal to the number of the processes. The variables are the key for controlling the characteristic value of the IC device.

One process control method as a self-correction method is provided in the prior art. The standard values of respective variables in combination corresponding to the target value of the result parameter are determined first. The respective processes correlated with the result parameter are controlled such that the difference between the real value of each variable and the standard value of the same is minimized, thereby making the value of the result parameter close to the target value of the same.

In an advanced process control (APC) method in the prior art, after the value of a variable of a process is found to have a substantial deviation, a variable of a subsequent process is adjusted according to the operator's experience to directly compensate the deviation of the variable of the former process. For example, in an IC manufacturing procedure including a deposition process and a later CMP process, the CMP-removed thickness is increased if the deposition thickness is overly large, or is decreased if the deposition thickness is overly small.

Since the above APC method utilizes adjustment of a variable of the subsequent process to directly compensate the deviation of a variable of the former process, it can only be applied to a manufacturing procedure where all variables correlated with the property to be controlled have the same physical quantity but cannot be applied to one where the variables correlated with the property to be controlled include different physical quantities, for example, a manufacturing procedure where the variables include the thickness of a film, an implantation concentration and temperature. Therefore, the application of the above APC method is much limited.

SUMMARY OF THE INVENTION

Accordingly, this invention provides a method of controlling a result parameter of an IC manufacturing procedure, which is applied to an IC manufacturing procedure where the variables correlated to the result parameter have different physical quantities.

The method of controlling a result parameter of an IC manufacturing procedure is based on the followings. The value of at least a first variable of a process correlated with the result parameter is acquired, and the difference between the predicted value and the target value of the result parameter is calculated from the same using a correlation equation of the first variable and the result parameter. A correcting action is performed to a subsequent process including at least one second variable correlated with the result parameter, which is based on a correlation equation of the second variable and the result parameter to control the subsequent process and adjust the second variable such that the difference is reduced due to affect of the second variable to the result parameter. The at least one first variable and the at least one second variable include two or more different physical quantities.

Accordingly, as the IC manufacturing procedure includes a plurality of processes correlated with the target result parameter, the control method of this invention includes performing the following steps to every two neighboring processes among the processes. The value of a variable of the earlier process among the two neighboring processes is acquired. The difference between the predicted value and the target value of the result parameter is calculated from the value of the variable of the earlier process using the correlation equation of the variable of the earlier process and the result parameter. A correcting action is then taken, including controlling the later process among the two neighboring processes to adjust the value of a variable of the later process according to the difference and the correlation equation of the variable of the later process and the result parameter, so as to reduce the difference between the predicted value and the target value of the result parameter through affect of the variable of the later process to the result parameter.

In an embodiment, the adjustment to the variable of the later process among any two neighboring processes does not make the value of the variable of the later process exceed the limit value of the variable of the later process allowed in the later process.

In an embodiment, whether the absolute value of the above difference exceeds a tolerance value or not is determined before the correcting action. If the absolute value of the difference exceeds the tolerance value, the correcting action is performed. If the absolute value of the difference does not exceed the tolerance value, the later process is controlled according to the standard value of the variable of the later process.

In a preferred embodiment of this invention, the IC manufacturing procedure includes a number "N" of processes correlated with the result parameter, wherein an i-th step includes at least one i-th variable correlated with the result parameter in a correlation equation and having a standard value $V_{i-0}$, and the result parameter has a target value $P_0$ when each variable has its standard value. Firstly, $j=k$ ($1 \leq k \leq N-1$) is set and a predicted accumulative deviation $\Delta P_C$ of the result parameter is set to zero, and then the following steps a-e are performed. In step a, the value $V_{j-r}$ of a j-th variable $V_j$ of the j-th process is acquired. In step b, the difference $\Delta V_{j-r}$ between $V_{j-r}$ and $V_{j-0}$ is calculated. In step c, a predicted variation $\Delta P_j$ of the result parameter is calculated from $\Delta V_{j-r}$ using the correlation equation of the j-th variable and the result parameter and then added to $\Delta P_C$. In step d, a correcting value $\Delta V_{(j+1)-d}$ capable of compensating $\Delta P_C$ is calculated from $\Delta P_C$ using the correlation equation of a (J+1)-th variable and the result parameter. In step e, the value of j is increased by one. The above steps a-e are repeated for at least one cycle if k is not equal to N−1, and an end is made when j is equal to N.

In an embodiment, the above control method further includes the following steps between the steps d and e. Whether $V_{(j+1)-0}+\Delta V_{(j+1)-d}$ exceeds a limit value $V_{(j+1)-lim}$ of the (j+1)-th variable allowed in the (j+1)-th process or not is determined. If $V_{(j+1)-0}+\Delta V_{(j+1)-d}$ does not exceed $V_{(j+1)-lim}$, the (j+1)-th process is controlled according to $V_{(j+1)-0}+\Delta V_{(j+1)-d}$. If $V_{(j+1)-0}+\Delta V_{(j+1)-d}$ exceeds $V_{(j+1)-lim}$, the (j+1)-th process is controlled according to $V_{(j+1)-lim}$.

In an embodiment, the correlation equation of any variable and the result parameter is a correlation equation of a variation in the variable and a variation in the result parameter and is under a condition that all of the other variables correlated with the result parameter are set at their respective standard values.

Moreover, the IC manufacturing procedure suitably controlled with this invention may be a MOS manufacturing procedure while the result parameter is the saturated drain current ($Id_{sat}$) or the threshold voltage (Vt) of a MOS transistor.

In an embodiment, the IC manufacturing procedure is a strained-silicon MOS manufacturing procedure while the result parameter is the saturated drain current ($Id_{sat}$) of a MOS transistor.

In an embodiment, the above control method further includes the following steps between the above steps c and d. Whether the absolute value ($|\Delta P_C|$) of $\Delta P_C$ exceeds a tolerance value or not is determined. If $|\Delta P_C|$ exceeds the tolerance value, the step d is performed. If $|\Delta P_C|$ does not exceed the tolerance value, the (j+1)-th process is controlled according to the standard value $V_{(j+1)-0}$ of the (j+1)-th variable and then the step e is performed.

It is particularly noted that the description "the (j+1)-th process is controlled according to $V_{(j+1)-0}+\Delta V_{(j+1)-d}$, $V_{(j+1)-lim}$ or $V_{(j+1)-0}$" mentioned above means that the (j+1)-th process is controlled according to a target that the (j+1) variable has the value of $V_{(j+1)-0}+\Delta V_{(j+1)-d}$, $V_{(j+1)-lim}$ or $V_{(j+1)-0}$ in the (j+1)-th process. Nevertheless, since there are usually certain errors in the controls of various conditions in a process, the target usually cannot be achieved precisely.

Accordingly, with the control method of this invention, the predicted deviation of the result parameter to be controlled caused by a deviation of a variable of a process can be reduced by adjusting a variable of a subsequent process. Thereby, the deviation of the result parameter can be minimized when the IC manufacturing procedure is finished. Moreover, since the control method of this invention can be applied to a manufacturing procedure where the variables correlated with the result parameter to be controlled include different physical quantities, the application thereof is much wider.

In order to make the aforementioned and other objects, features and advantages of the present invention comprehensible, a preferred embodiment accompanied with figures is described in detail below.

DESCRIPTION OF EMBODIMENTS

Figure 1:
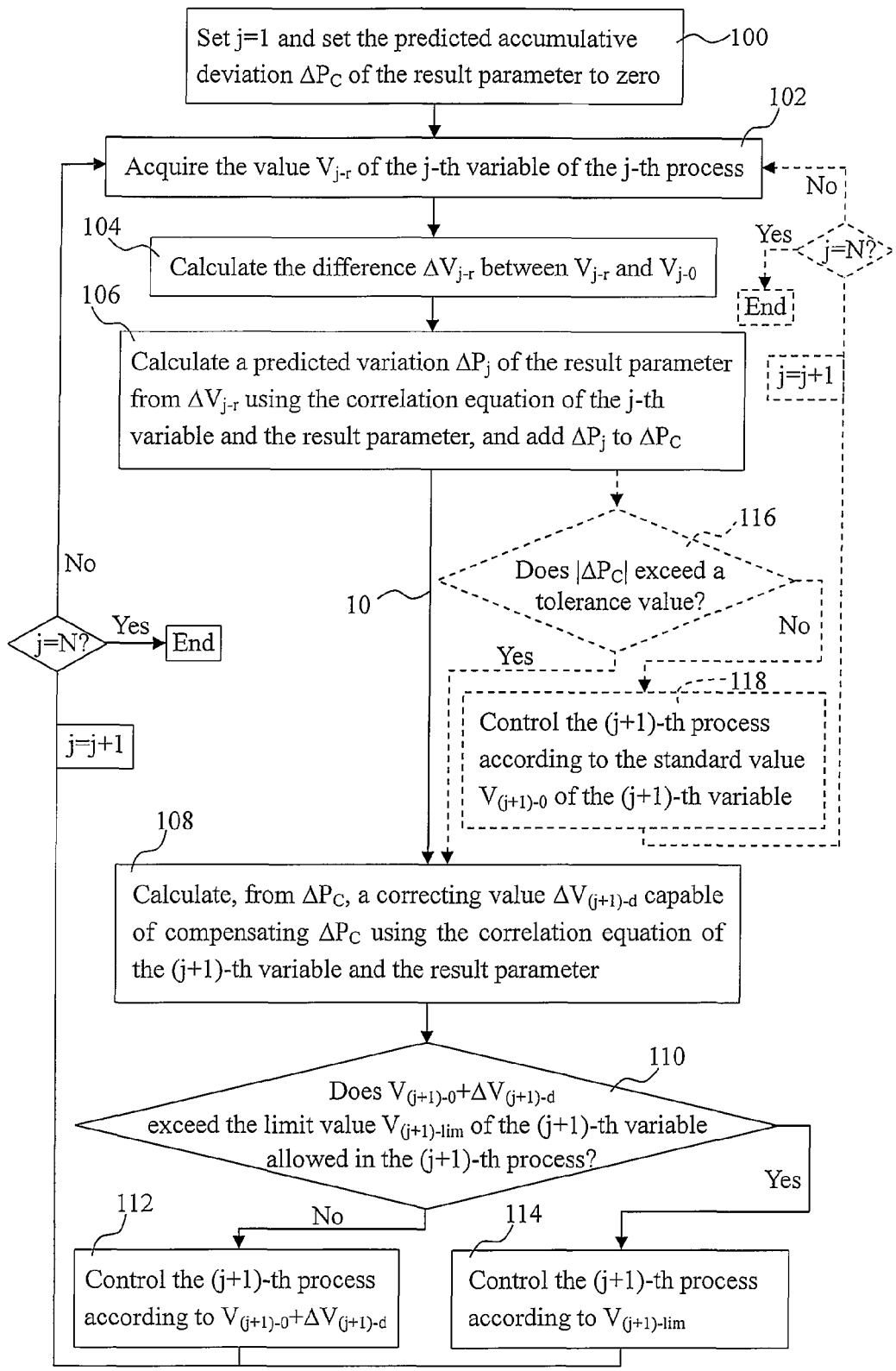
FIG. 1 illustrates a flow chart of a method of controlling a result parameter of an IC manufacturing procedure according to an embodiment of this invention.

FIG. 1 illustrates a flow chart of a method of controlling a result parameter of an IC manufacturing procedure according to an embodiment of this invention. In an example, the IC manufacturing procedure is a MOS process while the result parameter is the saturated drain current (Idsat) or the Vt of a MOS transistor The IC manufacturing procedure includes processes 1-N correlated with the result parameter, while other process(es) non-correlated or little correlated with the result parameter may be inserted before, after and/or between the processes 1-N. The i-th process among the processes 1-N includes at least one i-th variable correlated with the result parameter. For example, the first process includes one first variable $V_1$ and the second process includes two second variables $V_{2(1)}$ and $V_{2(2)}$. Accordingly, the number of the variables correlated with the result parameter may be equal to or larger than that of the processes correlated with the result parameter.

In addition, any i-th variable has its standard value $V_{i-0}$. For example, the above $V_1$ has a standard value $V_{1-0}$ and $V_{2(1)}$ and $V_{2(2)}$ respectively have standard values $V_{2(1)-0}$ and $V_{2(2)-0}$. The standard values of all the variables and the result parameter here are in a relationship that when each of the variables is at its standard value, the result parameter has the target value "$P_0$". The correlation of any i-th variable with the result parameter can be expressed by a correlation equation, which may be a correlation equation of a variation in the i-th variable and a variation in the result parameter. For example, the correlation equation of $V_1$ with the result parameter P can be expressed by a correlation equation "$\Delta P = \Delta f_1(V_1)$", which is under a condition that all the other variables correlated with the result parameter, $V_{2(1)}$, $V_{2(2)}$ and $V_3$-$V_N$, are set at their respective standard values ($V_{2(1)-0}$, $V_{2(2)-0}$ and $V_{3-0}V_{N-0}$). The correlation of $V_{2(1)}$ with the result parameter P can be expressed by a correlation equation "$\Delta P = \Delta f_{2(1)}(V_{2(1)})$" under a condition that all the other variables correlated with the result parameter, $V_1$, $V_{2(2)}$ and $V_3$-$V_N$, are set at their respective standard values ($V_{1-0}$, $V_{2(2)-0}$ and $V_{3-0}$-$V_{N-0}$).

Moreover, any of the above variables may be a set condition of the corresponding step, such as the flow rate of a gas, a temperature or a pressure, or alternatively a result of the corresponding step, such as the thickness of a film, etching depth or polishing-removed thickness.

Referring to FIG. 1, j=1 is set and the predicted accumulative deviation $\Delta P_C$ of the result parameter P is set to zero (step 100). It is noted that "j=1" means that the process control is started at the first process. If the process control is started at the m-th ($2 \leq m \leq N-1$) process, "j=m" has to be set in the step 100. The term "$\Delta P_C$" is the accumulated deviation of the result parameter caused by the deviations of the variables of the processes having been performed during the IC manufacturing procedure, and therefore has to be set to zero before the first process is conducted.

In next step 102, the value $V_{j-r}$ of a j-th variable $V_j$ of the j-th process is acquired. For example, when the first process includes one first variable $V_1$ correlated with the result parameter, the value $V_{1-r}$ of $V_1$ is acquired. When the first process includes two first variable $V_{1(1)}$ and $V_{1(2)}$ correlated with the result parameter, the respective values $V_{1(1)-r}$ and $V_{1(2)-r}$ of $V_{1(1)}$ and $V_{1(2)}$ are acquired.

In next step 104, the difference $\Delta V_{j-r}$ (=$V_{j-r}-V_{j-0}$) between the acquired value $V_{j-r}$ and the standard value $V_{j-0}$ of the j-th variable $V_j$ is calculated. For example, when the first process includes one first variable $V_1$ correlated with the result parameter, the difference $\Delta V_{1-r}$ between $V_{1-r}$ and the standard value $V_{1-0}$ is calculated. When the first process includes two first variable $V_{1(1)}$ and $V_{1(2)}$ correlated with the result parameter, the difference $\Delta V_{1(1)-r}$ between $V_{1(1)-r}$ and the standard value $V_{1(1)-0}$ and the difference $\Delta V_{1(2)-r}$ between $V_{1(2)-r}$ and the standard value $V_{1(2)-0}$ are calculated.

In next step 106, the predicted variation $\Delta P_j$ of the result parameter is calculated from the difference $\Delta V_{j-r}$ using the correlation equation of the j-th variable $V_j$ and the result parameter, and is added to $\Delta P_C$. For example, when the first process includes one first variable $V_1$ correlated with the result parameter, a predicted variation $\Delta P_1$ of the result parameter is calculated from $\Delta V_{1-r}$ using the correlation equation "$\Delta P = \Delta f_1(V_1)$" of the variable $V_1$ and the result parameter, and is then added to $\Delta P_C$. When the first process includes two first variable $V_{1(1)}$ and $V_{1(2)}$ correlated with the result parameter, a predicted variation $\Delta P_{1(1)}$ of the result parameter is calculated from $\Delta V_{1(1)-r}$ using the correlation equation "$\Delta P=\Delta f_{1(1)}(V_{1(1)})$" of the variable $V_{1(1)}$ and the result parameter, a predicted variation $\Delta P_{1(2)}$ of the result parameter is calculated from $\Delta V_{1(2)-r}$ using the correlation equation "$\Delta P=\Delta f_{1(2)}(V_{1(2)})$" of the variable $V_{1(2)}$ and the result parameter, and then both $\Delta P_{1(1)}$ and $\Delta P_{1(2)}$ are added to $\Delta P_C$.

In next step 108, the correlation equation of the (j+1)-th variable and the result parameter is used to calculated, from $\Delta P_C$, a correcting value $\Delta V_{(j+1)-d}$ of the (J+1)-th variable capable of compensating $\Delta P_C$. For example, when the second process includes two second variable $V_{2(1)}$ and $V_{2(2)}$ correlated with the result parameter, two equations "$\Delta P=\Delta f_{2(1)}(V_{2(1)})$" and "$\Delta P=\Delta f_{2(2)}(V_{2(2)})$" expressing the correlations of the two $2^{nd}$ variables $V_{2(1)}$ and $V_{2(2)}$ respectively with the result parameter are used to calculate, from $\Delta P_C$, respective correcting values $\Delta V_{2(1)-d}$ and $\Delta V_{2(2)-d}$ of the two $2^{nd}$ variables $V_{2(1)}$ and $V_{2(2)}$ capable of compensating $\Delta P_C$. Since two second variables are included in this case, the compensation amount can be shared by the two $2^{nd}$ variables in average, or be shared by the two $2^{nd}$ variables in different weights for other factor(s).

In next step 110, whether $V_{(j+1)-} + \Delta V_{(j+1)-d}$ exceeds the limit value $V_{(j+1)-lim}$ of the (j+1)-th variable allowed in the (j+1)-th process or not is determined. It is particularly noted that when the limit value is an upper (or lower) limit of a certain range, the above description "exceeds the limit value" means "is larger (or smaller) than the limit value". When the second process includes two second variable $V_{2(1)}$ and $V_{2(2)}$ correlated with the result parameter, for example, whether $V_{2(1)-0}+\Delta V_{2(1)-d}$ exceeds the limit value $V_{2(1)-lim}$ of the $2^{nd}$ variable $V_{2(1)}$ allowed in the second process or not is determined, and whether $V_{2(2)-0}+\Delta V_{2(2)-d}$ exceeds the limit value $V_{2(2)-lim}$ of the $2^{nd}$ variable $V_{2(2)}$ allowed in the second process or not is also determined.

If $V_{(j+1)-0}+\Delta V_{(j+1)-d}$ does not exceed $V_{(j+1)-lim}$, the (j+1)-th process is controlled according to $V_{(j+1)-0}+\Delta V_{(j+1)-d}$ (step 112). For example, in a case where the second process includes two second variable $V_{2(1)}$ and $V_{2(2)}$ correlated with the result parameter, the second process is controlled according to $V_{2(1)-0}+\Delta V_{2(1)-d}$ and $V_{2(2)-0}+\Delta V_{2(2)-d}$ if $V_{2(1)-0}+\Delta V_{2(1)-d}$ does not exceed $V_{2(1)-lim}$ and $V_{2(2)-0}+\Delta V_{2(2)-d}$ does not exceed $V_{2(2)-lim}$.

On the contrary, if $V_{(j+1)-0}+\Delta V_{(j+1)-d}$ exceeds $V_{(j+1)-lim}$, the (j+1)-th process is controlled according to $V_{(j+1)-lim}$ (step 114). For example, in a case where the second process includes two second variable $V_{2(1)}$ and $V_{2(2)}$ correlated with the result parameter, the second process is controlled according to $V_{2(1)-lim}$ and $V_{2(2)-lim}$ if $V_{2(1)-0}+\Delta V_{2(1)-d}$ exceeds $V_{2(1)-lim}$ and $V_{2(2)-0}+\Delta V_{2(2)-d}$ exceeds $V_{2(2)-lim}$. If one of $V_{2(1)-0}+\Delta V_{2(1)-d}$ and $V_{2(2)-0}+\Delta V_{2(2)-d}$ exceeds the corresponding limit value but the other does not, the second process is controlled according to the limit value and variable $V_{2(x)-0}+\Delta V_{2(x)-d}$ (x=1 or 2).

The value of j is then increased by one, and the flow is made back to the step 102. In a case where the previous $V_{(j+1)-0}+\Delta V_{(j+1)-d}$ exceeds $V_{(j+1)-lim}$ so that the (J+1)-th process is controlled according to $V_{(j+1)-lim}$, the insufficient compensation can be made up by controlling the variable(s) of the (j+2)-th process. Even if the previous $V_{(j+1)-0}+\Delta V_{(j+1)-d}$ does not exceed $V_{(j+1)-lim}$ so that the (j+1)-th process is controlled according to $V_{(j+1)-0}+\Delta V_{(j+1)-d}$, due to certain errors in the condition control of a process, the resulting value of the variable $V_{j+1}$ seldom coincides with the target of $V_{(j+1)-0}+\Delta V_{(j+1)-d}$ to make $\Delta P_C$ equal to zero. If this occurs, further correction can be done by controlling the variable(s) of the (j+2)-th process.

The change in the predicted accumulative deviation $\Delta P_C$ of the result parameter is discussed as follows. In next cycle of the steps 102-114, the absolute value of the $\Delta P_C$ after the addition of $\Delta P_2$ is surely smaller than that of the previous $\Delta P_C$, because when $V_{2-0}+\Delta V_{2-d}$ does not exceed $V_{2-lim}$ so that the $2^{nd}$ process is controlled according to $V_{2-0}+\Delta V_{2-d}$, the value of $\Delta V_{2-d}$ substantially corresponding to $\Delta P_2$ ($\Delta V_{2-r}$ that is acquired in reality and exactly corresponds to $\Delta P_2$ usually does not coincide with $\Delta V_{2-d}$ as the preset value) is derived in an intention to compensate the previous $\Delta P_C$. On the other hand, when $V_{2-0}+\Delta V_{2-d}$ exceeds $V_{2-lim}$ so that the $2^{nd}$ process is controlled according to $V_{2-lim}$, $V_{2-lim}$ that substantially corresponds to $\Delta P_2$ can partially compensate the previous $\Delta P_C$ at least.

Moreover, since there is no (N+1)-th process correlated with the result parameter in this example, an end is made if the new value of j after the increase of one is equal to N.

With the above flow of steps, the predicted deviation of the result parameter to be controlled caused by a deviation of a variable of a process can be easily reduced by adjusting a variable of a subsequent process, so that the deviation of the result parameter can be minimized at the end of the IC manufacturing procedure.

Moreover, since a compensation is meaningless when the absolute value ($|\Delta P_C|$) of $\Delta P_C$ is close to the inherent error in the compensation amount provided by variable adjustment in the process, a step 116 that determines whether $|\Delta P_C|$ exceeds a tolerance value or not may be inserted (with the arrow 10 ignored) between the steps 106 and 108 to determine whether a compensation is required or not. The tolerance value may be 1% of the target value $P_0$ of the result parameter. If $|\Delta P_C|$ exceeds the tolerance value, the step 108 is performed. If $|\Delta P_C|$ does not exceed the tolerance value, the (j+1)-th process is controlled according to the standard value $V_{(j+1)-0}$ of the (j+1)-th variable $V_{j+1}$ (step 118), the value of j is increased by one and then the flow is made back to the step 102. An end is made if the new value of j after the increase of one is equal to N.

For example, the saturated drain current (Idsat) of a MOS transistor generally correlates with the thickness of the gate dielectric layer, the critical dimension (CD) of the gate and the S/D implantation concentration, wherein the gate dielectric layer, the gate and the S/D regions are formed in sequence. With the above control method of this invention, the Idsat deviation caused by a deviation in the thickness of the gate dielectric layer can be compensated by adjusting the critical dimension of the gate, and the Idsat deviation caused by a deviation in the critical dimension of the gate can be compensated by adjusting the S/D implantation concentration.

A strained-silicon MOS transistor fabricating process shown in the following Table 1 is an IC manufacturing procedure suitably controlled with the control method of this invention, wherein the result parameter to be controlled is the Idsat.

TABLE 1

(Result parameter = Idsat)

| # of Process | Process | Variable | Border condition of variable | Effect of out of border condition |
|---|---|---|---|---|
| 1 | Si recess | Recess depth | <Threshold recess depth | bulk leakage (larger) |
| 2 | SiGe epitaxy | Ge concentration | <Threshold Ge concentration | dislocation (higher) |
|   |   | Elevation height | <Gate height | — |
| 3 | Compressive SiN deposition | Thickness | <½ minimal pitch size | Spacer or contact under-etching (larger) |
| 4 | UV curing | Temperature | <450° C. | salicide phase change (higher) |

Because the method of controlling a result parameter of an IC process of this invention can be applied to an IC process where the variables correlated with the result parameter include different physical quantities, such as the process shown in Table 1, the application thereof is much wider.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of controlling a result parameter of an integrated circuit (IC) manufacturing procedure, wherein the IC manufacturing procedure includes a number "N" of processes correlated with the result parameter, an i-th process includes at least one i-th variable correlated with the result parameter in a correlation equation and having a standard value $V_{i-0}$, the variables include two or more different physical quantities and the result parameter has a target value $P_0$ when each variable has its standard value, comprising:
    setting j=k ($1 \leq k \leq N-1$) and setting a predicted accumulative deviation $\Delta P_C$ of the Result parameter to zero;
    a) acquiring a value $V_{j-r}$ of a j-th variable of a j-th process;
    b) calculate a difference $\Delta V_{j-r}$ between $V_{j-r}$ and $V_{j-0}$;
    c) calculating a predicted variation $\Delta P_j$ of the result parameter from $\Delta V_{j-r}$ using a correlation equation of the j-th variable and the result parameter, and adding $\Delta P_j$ to $\Delta P_C$;
    d) calculating, from $\Delta P_C$, a correcting value $\Delta V_{(j+1)-d}$ capable of compensating $\Delta P_C$ using a correlation equation of a (j+1)-th variable and the result parameter;
    e) increasing the value of j by one; and
    repeating the steps a-e for at least one cycle if k is not equal to N−1, and making an end when j is equal to N.

2. The method of claim 1, further comprising, between the steps d and e, steps of:
    determining whether $V_{(j+1)-0}+\Delta V_{(j+1)-d}$ exceeds a limit value $V_{(j+1)-lim}$ of the (j+1)-th variable allowed in the (j+1)-th process or not; and
    controlling the (j+1)-th process according to $V_{(j+1)-0}+\Delta V_{(j+1)-d}$ if $V_{(j+1)-0}+\Delta V_{(j+1)-d}$ does not exceed $V_{(j+1)-lim}$, or controlling the (j+1)-th process according to $V_{(j+1)-lim}$ if $V_{(j+1)-0}+\Delta V_{(j+1)-d}$ exceeds $V_{(j+1)-lim}$.

3. The method of claim 1, wherein the correlation equation of any variable and the result parameter is a correlation equation of a variation in the variable and a variation in the result parameter and is under a condition that all of the other variables correlated with the result parameter are set at their respective standard values.

4. The method of claim 1, wherein the IC manufacturing procedure is a MOS manufacturing procedure and the result parameter is a saturated drain current (Idsat) or a threshold voltage of a MOS transistor.

5. The method of claim 1, wherein the IC manufacturing procedure is a strained-silicon MOS manufacturing procedure and the result parameter is a saturated drain current (Idsat) of a MOS transistor.

6. The method of claim 1, further comprising, between the steps c and d, steps of:
    determining whether the absolute value ($|\Delta P_C|$) of $\Delta P_C$ exceeds a tolerance value or not; and
    directly going to the step d if $|\Delta P_C|$ exceeds the tolerance value, or controlling the (j+1)-th process according to the standard value $V_{(j+1)-0}$ of the (j+1)-th variable and then going to the step e if $|\Delta P_C|$ does not exceed the tolerance value.

7. A method of controlling a result parameter of an integrated circuit (IC) manufacturing procedure, comprising:
    providing a first process correlated with the result parameter and a subsequent second process correlated with the result parameter;
    providing at least one first variable correlated with the result parameter for the first process and at least one second variable correlated with the result parameter for the second process, wherein the variables include two or more different physical quantities and each of the first and second variables is correlated with the result parameter in a correlation equation;
    acquiring a value of the first variable of the first process;
    calculating, from the acquired value of the first variable, a difference between a predicted value and a target value of the result parameter using the correlation equation of the first variable and the result parameter; and
    taking a correcting action that comprises controlling the second process to adjust the value of the second variable according to the difference and the correlation equation of the second variable and the result parameter, so as to reduce the difference between a predicted value and a target value of the result parameter through an affect of the second variable to the result parameter.

8. The method of claim 7, wherein the adjustment to the second variable does not make the value of the second variable exceed a limit value of the second variable allowed in the second process.

9. The method of claim 7, further comprising, before the correcting action is taken, steps of:
    determining whether the absolute value of the difference exceeds a tolerance value or not; and performing the correcting action if the absolute value of the difference exceeds the tolerance value, or controlling the second process according to a standard value of the second variable if the absolute value of the difference does not exceed the tolerance value.

10. The method of claim 7, wherein the IC manufacturing procedure is a MOS manufacturing procedure and the result parameter is a saturated drain current (Idsat) or a threshold voltage of a MOS transistor.

11. The method of claim 7, wherein the IC manufacturing procedure is a strained-silicon MOS manufacturing procedure and the result parameter is a saturated drain current (Idsat) of a MOS transistor.

12. A method of controlling a result parameter of an integrated circuit (IC) manufacturing procedure comprising:
   providing a plurality of processes correlated with the result parameter, wherein each process includes at least one variable correlated with the result parameter in a correlation equation and the variables include two or more different physical quantities; and
   performing, to every two neighboring processes among the plurality of processes, steps of:
   acquiring a value of a variable of an earlier process among the two neighboring processes;
   calculating, from the acquired value of the variable of the earlier process, a difference between a predicted value and a target value of the result parameter using the correlation equation of the variable of the earlier process and the result parameter; and
   taking a correcting action that comprises controlling a later process among the two neighboring processes to adjust a value of a variable of the later process according to the difference and the correlation equation of the variable of the later process and the result parameter, so as to reduce the difference between a predicted value and a target value of the result parameter through an affect of the variable of the later process to the result parameter.

13. The method of claim 12, wherein the adjustment to the variable of the later process among any two neighboring processes does not make the value of the variable of the later process exceed a limit value of the variable of the later process allowed in the later process.

14. The method of claim 12, further comprising, before the correcting action is taken, steps of:
   determining whether the absolute value of the difference exceeds a tolerance value or not; and
   performing the correcting action if the absolute value of the difference exceeds the tolerance value, or controlling the later process according to a standard value of the variable of the later process if the absolute value of the difference does not exceed the tolerance value.

15. The method of claim 12, wherein the IC manufacturing procedure is a MOS manufacturing procedure and the result parameter is a saturated drain current (Idsat) or a threshold voltage of a MOS transistor.

16. The method of claim 12, wherein the IC manufacturing procedure is a strained-silicon MOS manufacturing procedure and the result parameter is a saturated drain current (Idsat) of a MOS transistor.

* * * * *